United States Patent [19]
Harkness et al.

[11] Patent Number: 5,820,944
[45] Date of Patent: Oct. 13, 1998

[54] ULTRAVIOLET-CURABLE COMPOSITION AND METHOD FOR FORMING CURED-PRODUCT PATTERNS THEREFROM

[75] Inventors: Brian R. Harkness, Cowbridge, Canada; Mamoru Tachikawa; Kasumi Takei, both of Kanagawa, Japan

[73] Assignee: Dow Corning Asia, Ltd., Tokyo, Japan

[21] Appl. No.: 829,786

[22] Filed: Mar. 31, 1997

[30] Foreign Application Priority Data

Apr. 1, 1996 [JP] Japan ................................. 8-078893

[51] Int. Cl.$^6$ .............................. C08J 7/04; G03F 7/075; C08G 77/08
[52] U.S. Cl. .......................... 427/510; 427/512; 427/515; 427/517; 522/63; 522/86; 522/148; 528/21; 528/25; 528/31; 528/33; 430/270.1
[58] Field of Search ................................ 522/63, 86, 148; 528/21, 25, 31, 33; 427/510, 512, 515, 517; 430/270.1

[56] References Cited

FOREIGN PATENT DOCUMENTS

| 0 555 749 A1 | 8/1993 | European Pat. Off. ........ G03F 7/004 |
| 58-174418 | 10/1983 | Japan ............................ C08G 59/68 |
| 6-80879 | 3/1994 | Japan ............................ C08L 83/04 |
| 6-148887 | 5/1994 | Japan ............................ H01L 21/30 |
| 6-273936 | 9/1994 | Japan ............................ H01L 21/30 |

OTHER PUBLICATIONS

Chemistry and Technology of Silicones, 2nd Editions, p. 90, p. 205, p .397, Walter Noll Academic Press, Inc. (London) Ltd., 1968.
Organosilicon Compounds, p. 200, C. Eaborn, Butterworths Scientific Publications (London), 1960.
Encyclopedia of Polymer Science Engineering, vol. 9, pp. 97–138, Lithographic Resists, Wiley Interscience (New York), 1985.
S. I. Schlesinger, Polymer Engineering and Science, Jul. 1974, vol. 14, No. 7, p. 513.
G. Smets, A. Aerts, and J. Van Erum, Polymer Journal, vol. 12, No. 9, pp. 539–547, 1980.
Jpn. J. Appl. Phys., vol. 32 (1993) pp. 6052–6058.
S. Hayase, Y. Onishi, K. Yoshikiyo, S. Suzuki and M. Wada, Journal of Polymer Science: Polymer Chemistry Edition, vol. 20, p. 3155, 1982.
S. Hayase, T. Ito, S. Suzuki, and M. Wada, Journal of Polymer Science: Polymer Chemistry Edition, vol. 19, pp. 2185–2194, 1981.
S. Hayase, Y. Onishi, S. Suzuki, and M. Wada, Macromolecules 1985, 18, pp. 1799–1804.
M. R. Winkle, K. A. Graziano, Journal of Photopolymer Science and Technology, vol. 3, 1990, pp. 419–422.
J. F. Cameron, J. M. J. Frechet, J. Am. Chem. Soc. 1991, 113, 4303–4313.
J. M. J. Frechet, J.F. Cameron, Polym. Mater. Sci. Eng. (64), 1991 pp. 55–56.
S. K. Weit, C. Kutal, Chem. Mater, 1992, 4, 453–457.
C. Kutal, C. G. Willson, J. Electrochem. Soc., 134, 2280–2285, Sep. 1987.

*Primary Examiner*—Susan W. Berman
*Attorney, Agent, or Firm*—Sharon K. Severance

[57] ABSTRACT

The present invention pertains to a curable composition which comprises a) a N-substituted 4-(o-nitrophenyl) dihydropyridine which constitutes a base-generating substance that is caused to generate a base by the action of ultraviolet light, and (b) a silicone polymer ($R_2SiO_{2/2}$) ($RSiO_{3/2}$) containing silicon-hydrogen bonds (Si—H) which are capable of reacting with hydroxy groups to form silicon-oxygen bonds (Si—O) and hydrogen molecules ($H_2$) under the effect of the base. This composition is cured by irradiation with ultraviolet light. Patterns are formed by placing a mask between a coating film of the composition and the ultraviolet light source during the irradiation with ultraviolet light, and then dissolving and removing the uncured portions of the composition following said irradiation.

19 Claims, No Drawings

ULTRAVIOLET-CURABLE COMPOSITION AND METHOD FOR FORMING CURED-PRODUCT PATTERNS THEREFROM

BACKGROUND OF THE INVENTION

This invention pertains to a radiation-curable silicon-containing resin composition which can be used in the manufacture of insulating films for semiconductor devices and a method for manufacturing patterns comprising a cured silicone product and inorganic silicon oxide utilizing said composition.

It is known in the art that hydrogen atoms bonded directly to silicon atoms will react with the hydroxy groups of water, alcohols or silanols to form hydrogen molecules and silicon-oxygen bonds, Si—O. At high temperatures, this reaction will proceed even with a catalyst; however, it is widely known that the reaction proceeds more readily in the presence of transition metal catalysts such as platinum or palladium; basic catalysts such as alkali metal hydroxides or amines; or Lewis acid catalysts such as tin compounds. Furthermore, is known that cross-linking reactions involving Si—H and SiOH which utilize this reaction can be used in room-temperature curing reactions of silicones.

Resin curing reactions utilizing the effects of ultraviolet radiation, and techniques associated with such reactions, have been described in the literature. Examples of using the effects of ultraviolet radiation include curing based on crosslinking reactions and curing based on polymerization reactions.

Crosslinking reactions include curing utilizing photo-dimerization reactions of cinnamic acid compounds, curing utilizing reactions between mercapto groups and olefins, and curing utilizing diazo groups or azide groups as photosensitive groups. Dimerization reactions of cinnamic acid compounds and reactions utilizing radicals generated from diazo groups or azide groups are equivalent reactions with respect to the photo-reaction (i.e., there is no amplifying effect). Accordingly, such reactions are unsuitable for application to curing using low-intensity ultraviolet light (i.e., ultraviolet light with a small number of photons). Methods utilizing an addition reaction in which a mercaptan is added to an olefin suffer from the problem of corrosive properties and a bad odor originating in the mercaptan.

Examples of the polymerization reactions include methods combining functional groups such as acryloyl groups or methacryloyl groups with polymerization initiators that generate radicals when exposed to radiation, and methods in which cationic polymerization initiators are generated by irradiation with radiation. The cationic polymerization of epoxy groups, lactones or active vinyl groups is performed using these initiators. Methods using the radical polymerization of functional groups such as acryloyl groups or methacryloyl groups curing is impeded by oxygen.

There are also curing methods which use a substance that generates an acid when irradiated with ultraviolet radiation, and which cause a cross-linking reaction or polymerization reaction to take place through the catalytic action of the acid produced.

In the methods using acid generating substances there is an amplifying effect in the cross-linking reaction even if the intensity of the ultraviolet light is low and such curing reactions are not impeded by oxygen. However, since an acid is involved, corrosion of the substrate tends to occur and since ionic residues are present, there are problems in the electrical characteristics of the cured product.

The use of acid-generating catalyzed methods is typically limited to epoxy groups or acrylic groups. Japanese Patent Application Kokai No. 6-80879 discloses the manufacture of thin films of silicate glass using combinations of specified siloxanes with substances which generate an acid when acted upon by ultraviolet light. However, specialized polysiloxanes are required and the weight reduction caused by the cross-linking reaction is severe. This second drawback creates fatal problems such as the formation of pinholes and generation of cracks during curing in cases when the method is applied to forming protective films, insulating coatings or fattening coatings.

Japanese Patent Application Kokai No. 58-174418 discloses a method for the photo-curing of epoxy resins using aluminum compounds and o-nitrobenzoyloxysilicon compounds.

There are also several methods known in the art in which the curing reaction is effected using a substance which generates a base when irradiated with ultraviolet radiation. The base-generating substances include organic and inorganic nitrogen-containing compounds such as o-nitrobenzyl carbamate compounds, metal-amine complexes and 4-(o-nitrophenyl)dihydropyridines. Organic amines, ammonia or quaternary ammonium hydroxides are irradiated with ultraviolet radiation.

In the base-generating method an amplifying effect is obtained in the cross-linking reaction even if the intensity of the radiation is low, and there is no oxygen interference. Furthermore, compared to methods which use an acid, there is little problem of substrate corrosion. However, the application of such methods is extremely limited. For example, EP 0555749 A1 discloses a method in which a phenol resin, epoxy cross-linking agent and melamine curing agent are cured using a basic catalyst.

Japanese Patent Application Kokai No. 6-149887 discloses a method in which polysilsesquioxanes alone, and compositions consisting of polysilsesquioxanes and tetraphenoxysilane are cured. In JP887 the sensitivity (D50—amount of irradiation producing a residual film rate of 50% in the developing process) is extremely low. Additionally, it appears that curing is attributable to a condensation reaction in which water, alcohols or phenols are produced as by-products, so that there is a large weight reduction accompanying curing.

Japanese Patent Application Kokai 6-273936 discloses a photosensitive resin composition using a siloxane polymer and a base-generating agent, and a pattern forming method using this composition. In JP 936 the sensitivity (D50) is not reported; however, the amount of irradiation is 100 mJ/cm$^2$ to 300 mJ/cm$^2$ (365 nm), so it appears that the sensitivity is low. Additionally, the curing appears to be based on a condensation reaction in which water or alcohols are produced as by-products, so that curing is accompanied by considerable weight reduction and shrinkage.

In the examples mentioned above, it is believed that the extremely low sensitivity is attributable to the fact that the basicity of the amines generated from the base-generating substances is low, so that the condensation reaction is slow.

Among the curing reactions described above, all produce cross-linking groups which have a low thermal stability. Therefore, cured products able to withstand use or working at high temperatures cannot be obtained.

It is an object of the present invention is to provide an ultraviolet-curable composition which shows very little weight reduction accompanying curing, which shows no inhibition of curing by air or oxygen, which can be efficiently cured by irradiation with a small amount of ultraviolet light, which shows a high resolution in pattern formation, and which makes it possible to produce a cured-product pattern with a superior heat resistance by means of a heat treatment performed following pattern formation. It is further an object to provide a method for forming cured-product patterns using the composition.

SUMMARY OF THE INVENTION

The invention relates to a curable composition comprising (a) 0.01 to 20 wt % based on the overall weight of the composition of a base-generating substance which generates a base by the action of ultraviolet light; (b) a siloxane polymer containing silicon-hydrogen bonds (Si—H) which are capable of reaction with hydroxy groups (OH) to form silicon-oxygen bonds (Si—O) and hydrogen molecules ($H_2$) under the effect of the base and optionally (c) a cross-linking agent having hydroxy groups. Specifically, the base-generating substance is a N-substituted 4-(o-nitrophenyl) dihydropyridine and the siloxane polymer is of the general formula $(R_2SiO_{2/2})_a(RSiO_{3/2})_b$.

THE INVENTION

This invention pertains to a curable composition comprising (a) 0.01 to 20 wt. % based on the weight of the composition of a N-substituted 4-(o-nitrophenyl) dihydropyridine, (b) a siloxane polymer having the general formula $(R_2SiO_{2/2})_a(RSiO_{3/2})_b$, wherein each R is independently selected from the group consisting essentially of hydrogen atoms and hydrocarbon groups with 1 to 8 carbon atoms with the provision that; the sum of the moieties in which the R in $RSiO_{3/2}$ is a hydrogen atom and the moieties in which one or both of the R's in $R_2SiO_{2/2}$ is a hydrogen atom is at least 5% of amount of $RSiO_{3/2}$ unit and $R_2SiO_{2/2}$ unit; and $0 \leq a \leq 1$, $0 \leq b \leq 1$ and $a+b=1$; and (c) optionally a crosslinking agent having hydroxyl groups. In this siloxane polymer at least one of the divalent oxygen atoms bonded to the silicon atom in each of $R_2SiO_{2/2}$ and $RSiO_{3/2}$ is bonded to another silicon atoms to form a siloxane bond; the remaining oxygen atoms may be bonded to other silicon atoms to form siloxane bonds, bonded to methyl groups or ethyl groups to form alkoxy groups, or bonded to hydrogen atoms to form silanol groups.

This composition is cured by irradiating with ultraviolet light so that a basic compound is generated in the irradiated portions and thereafter heating the composition at an appropriate temperature promoting a cross-linking reaction. The heating is performed in an atmosphere with a relative humidity of 10% or greater, so that water in the atmosphere enters the composition and participates in the cross-linking reaction.

In the curable composition the base generating substance is a N-a substituted 4-(o-nitrophenyl) dihydropyridine. In these compounds, a hydrocarbon group is bonded to dihydropyridine in position 1. This base-generating substance is included in the curable composition at the rate of 0.01 to 20 wt % relative to the overall weight of the composition. If the amount added is too small, the curing reaction will be retarded. If the amount added is excessively large, the physical properties of the composition prior to curing may be weakened, and the physical properties of the cured composition may be lost. It is preferred that the amount of the base-generating substance that is included in the curable composition be 0.05 to 10 wt % and more preferably be 0.1 to 5 wt % based on the overall weight of the composition.

Preferred are base-generating substances are compounds selected from a set consisting of 4-(o-nitrophenyl) dihydropyridines in which a substituent group bonded to the dihydropyridine in position 1 is selected from the group consisting essentially of alkyl group, alkenyl groups, aryl groups and aralkyl groups in which a substituent group bonded to the dihydropyridine in positions 2 and 6 are hydrocarbon groups with 1 to 3 carbon atoms; and in which a substituent group bonded to the dihydropyridine in position 3 and 5 are alkoxycarbonyl groups selected from a set consisting of alkoxy groups with 1 to 4 carbon atoms. Preferred compounds are N-substituted 4-(o-nitrophenyl) dihydropyridines in which a methyl group, ethyl group or benzyl group is bonded to the dihydropyridine in position 1, methyl groups or ethyl groups are bonded in positions 2 and 6, and alkoxycarbonyl groups selected from a set of alkoxy groups with 1 to 4 carbon atoms are bonded in positions 3 and 5.

Compared to o-nitrobenzyl carbamate compounds, which are conventionally well known as photolyzable base-generating substances, 4-(o-nitrophenyl)dihydropyridines undergo photolysis at longer radiation wavelengths, i.e., at wavelengths of 300 to 400 nm. Furthermore, the photolysis rate is extremely rapid, and the base generated is a quaternary ammonium hydroxide, which has a higher catalytic activity groups that the amine compounds produced by carbamate compounds.

In the curable composition of the invention, the siloxane polymer has silicon-hydrogen bonds (Si—H) and is represented by general formula $(R_2SiO_{2/2})_a(RSiO_{3/2})_b$. In this formula, each R is independently selected from the group consisting essentially of hydrogen atoms, hydrocarbon groups with 1 to 8 carbon atoms and derivatives of the same. However, the sum of the moieties in which the R in $RSiO_{3/2}$ is a hydrogen atom and the moieties in which one or both of the R's in $R_2SiO_{2/2}$ is a hydrogen atom is at least 5% of amount of $RSiO_{3/2}$ unit and $R_2SiO_{2/2}$ unit. At least one of the divalent oxygen atoms bonded to the silicon atom in each $R_2SiO_{2/2}$ and $RSiO_{3/2}$ is bonded to another silicon atom to form a siloxane bond; the remaining oxygen atoms may be bonded to other silicon atoms to form siloxane bonds, bonded to methyl groups or ethyl groups to form alkoxy groups, or bonded to hydrogen atoms to form silanol groups. In the silicone polymer molecule, a and/or b are defined as follows; $0 \leq a \leq 1$, $0 \leq b \leq 1$, and $a+b=1$.

R may be exemplified by hydrogen, methyl, ethyl, butyl, hexyl, cyclohexyl, octyl, trifluoropropyl, trimethylsilyl methyl, phenyl, para-tolyl, meta-tolyl, phenethyl, 4-vinylphenyl and others.

Examples of $R_2SiO_{2/2}$ include $Me_2SiO_{2/2}$, $MeHSiO_{2/2}$, $MePhSiO_{2/2}$, $MeViSiO_{2/2}$, $Me(F_8Pr)SiO_{2/2}$, $MeEtSiO_{2/2}$, $Ph_2SiO_{2/2}$, $PhHSiO_{2/2}$, and $PhViSiO_{2/2}$. Examples of $RSiO_{3/2}$ include $HSiO_{3/2}$, $MeSiO_{3/2}$, $EtSiO_{3/2}$, $PrSiO_{3/2}$, $Me_3SiMeSiO_{3/2}$ and $PhSiO_{3/2}$. Me represents a methyl group, Ph represents a phenyl group, Vi represents a vinyl group, Et represents an ethyl group and Pr represents a propyl group.

Siloxane polymers which have $HSiO_{3/2}$ include D-T resins $\{(R_2SiO_{2/2})(HSiO_{3/2})\}$. These resins are known in the art and may be manufactured by cohydrolysis of mixtures of chlorosilanes such as dimethyldichlorosilane, methyltrichlorosilane and trichlorosilane; or dimethyldichlorosilane, phenyltrichlorosilane and trichlorosilane; or dimethyldichlorosilane and trichlorosilane; or diphenyldichlorsilane, methyltrichlorosilane and trichlorosilane; or diphenyldichlorosilane, phenyltrichlorosilane and trichlorosilane; or diphenyldichlorosilane and trichlorosilane.

The resins may also be manufactured by hydrolysis and a condensation reaction using diphenylsilanediol, methyltrichlorosilane and trichlorosilane; or diphenylsilanediol, phenyltrichlorosilane and trichlorosilane; or diphenylsilanediol and trichlorosilane.

Additionally the resins may be manufactured by a condensation reaction using diphenyldisilanediol, methyltrimethoxysilane and trimethoxysilane.

Polyhydrodienesilsesquioxane type resins may be manufactured by cohydrolysis using phenyltrichlorosilane and trichlorosilane; or methyltrichlorosilane and trichlorosilane; or cyclohexyltrichlorosilane and trichlorosilane; or n-hexyltrichlorosilane and trichlorosilane; or 4-vinylphenyltrichlorosilane and trichlorosilane; or by hydrolysis using trichlorosilane; or trimethoxysilane; or triethoxysilane.

Examples of siloxane polymers containing $HRSiO_{2/2}$ include silicone polymers whose main constituent components are straight-chain structures such as diphenylsiloxane-methyl-hydrodienesiloxane copolymers whose principal chains consist of methylhydrodienesiloxane ($CH_3(H)SiO$) and diphenylsiloxane ($Ph_2SiO$)); and ($HRSiO_{2/2}$)$RSiO_{3/2}$) "D-T" resins.

The D-T resins may be manufactured by cohydrolysis using cyclic siloxane compounds such as a cyclic oligomer of methylhydrodienesiloxane or a cyclic oligomer of phenylhydrodienesiloxane, methyltrichlorosilane and dichlorosilane; or phenyltrichlorosilane and dichlorosilane; or methyltrichlorosilane and methyldichlorosilane; or phenyltrichlorosilane and methyldichlorosilane; or methyltrichlorosilane and phenyldichlorosilane; or phenyltrichlorosilane and phenyldichlorosilane.

If a small amount of silane compound which is capable of providing a M compound ($R_3SiO_{1/2}$) by hydrolysis, such as trimethylchlorosilane, vinyldimethylchlorosilane, dimethylchlorosilane or 4-(vinylphenyl)dimethylchlorosilane, is used in the resin synthesis reaction, the molecular weight of the resin can be adjusted, and reactive functional groups such as vinyl groups or 4-vinylphenyl groups can be introduced. If a silane compound which is capable of providing a Q component ($SiO_{4/2}$) by hydrolysis, such as silicon tetrachloride or methyl ortho-silicate is used, the molecular weight and hardness of the resin can be adjusted.

The curable composition may optionally comprise (c) a cross-linking agent which has hydroxy groups. The cross-linking agent is a compound which is capable of forming a cross-linking structure between the silicone polymer by reacting with the silicon-hydrogen bonds (Si—H) to form siloxane bonds (Si—O—Si). It is preferred that the cross-linking agent be selected from the group consisting essentially of a silane compounds having an average of at least two silanol groups (SiOH) per molecule, a silicone polymer having an average of at least two silanol groups (SiOH) per polymer molecule and water.

Examples of the silane compounds having at least two silanol groups per molecule include diarylsilanediols such as diphenylsilanediol, dimeta-tolylsilanediol and diparatolylsilanediol, and others; and dialkylsilanediols with high-bulk alkyl groups, such as dicyclohexylsilanediol.

Examples of silicone polymers having an average of at least two silanol groups (SiOH) per polymer molecule include silanol-functional polysilsesquioxanes; dimethylsiloxane oligomer and polymers in which both ends are stopped by silanol groups, diphenylsiloxane oligomer in which both ends are stopped by silanol groups, terminal silanol-stopped polyphenylsilsesquioxanes and terminal silanol-stopped polymethylsilsesquioxanes, as well as D-T resins which have silanol groups, MQ resins in which some or all of the $R_3SiO_{1/2}$ units consist of substituent groups with silanol groups which can be expressed by the formula $(HO)R_2SiO_{1/2}$, diphenylsiloxane-methylsilsesquioxane copolymer resins which have silanol groups, dimethylsiloxane-phenylsilsesquioxane copolymer resins which have silanol groups, and diphenylsiloxane-phenylsilsesquioxane copolymer resins which have silanol groups. Furthermore, if the siloxane polymer (b) has at least two silanol groups (SiOH) per polymer molecule, the resin itself may function as the cross-linking agent.

The curable composition is irradiated with radiation at a temperature of 0° C. to 100° C. in an atmospheric having a relative humidity of 10% or greater, with a light-blocking pattern (mask) placed between a coating of the curable composition and the ultraviolet radiation source. When hydroxy groups (OH) are present in the curable composition, water (water vapor) need not be present in the atmosphere.

Following irradiation, if necessary, the irradiated coating is treated for 1 hour or less at 0° C. to 200° C., causing a reaction to proceed in which a silicon-oxygen bonds (Si—O) and hydrogen molecules ($H_2$) are formed from [i] the hydroxy groups (OH) or water molecules which have entered said curable composition from the atmosphere, and [ii] silicon-hydrogen bonds (Si—H), as a result of the catalytic effect of a basic compound produced in the areas irradiated with ultraviolet radiation. As a result, a cross-linking structure is formed so that a latent image is formed in the coating. The resulting coating is contacted with an inorganic or organic solvent so that the uncured portions of the curable composition are dissolved and removed (developing process) forming a negative pattern consisting of the cured coating. If necessary, further heating is performed so that the curing reaction of the silicone resin is accelerated, forming a cured silicone pattern corresponding to the negative of the photo-mask.

As used herein, the term "ultraviolet light" refers to light with a wavelength of 200 to 400 nm. Although there are no particular restrictions on ultraviolet irradiation time, it is desirable that the irradiation time be sufficient to decompose a considerable portion, i.e., 10 to 100%, of the base-generating substance, converting said substance into a basic compound catalyst. The conditions of heat-curing following the formation of the negative pattern depend on the properties of the individual resins. The heat-curing is not always requisite; however in the case of organic resins, such as silicone resins having organic group, heat-curing in the range of 50° C. to 400° C. may be appropriate, while in the case of inorganic resins such as by polyhydrodiene-silsesquioxane, heat-curing at 200° C. to 1400° C. may be appropriate.

Coatings may be produced from the curable composition by applying a solution of the curable composition is applied to the surface of a substrate by a method such as spin coating, casting or painting, and removing some or all of the solvent. A photo-mask which partially blocks the ultraviolet radiation is placed between the coating and the ultraviolet radiation source, and the coating is irradiated. Either immediately or following an after-treatment which is performed in order to promote the curing reaction, the substrate is washed with an inorganic or organic solvent so that the uncured portions of the coating are removed, producing a pattern consisting of the cured coating. After the solvent is dried, if necessary a heat treatment is again performed so that the pattern consisting of the cured coating is further cured.

There are no particular restrictions on the solvent used for the coating application of the curable composition, as long as said solvent will dissolve the curable composition without reacting with said composition, and has an appropriate degree of volatility so that said solvent can be removed at ordinary temperatures or by being heated to a temperature of 200° C. or less. Suitable solvents from the standpoints of solvent toxicity and ignition characteristics include saturated hydrocarbons such as hexane, heptane, octane, decane, dodecane, cyclohexane, cycloheptane, cyclooctane and decahydronaphthalene, and others; aromatic hydrocarbons such as toluene, xylene, mesitylene, ethylbenzene, t-butylbenzene and tetrahydronaphthalene, and others; halogenated hydrocarbons such as methylene chloride, chlorobenzene and dichlorobenzene, and others; ethers such as tetrahydrofuran, propyl ether, butyl ether, pentyl ether, phenyl ether, anisole and t-butylphenyl ether, and others; ketones such as acetone, methyl ethyl ketone, diethyl ketone, methyl propyl ketone, methyl butyl ketone, methyl isobutyl ketone, methyl (t-butyl)ketone, methyl pentyl ketone and diisopropyl ketone, and others; esters such as ethyl acetate, propyl acetate, butyl acetate, t-butyl acetate, methyl propionate, ethyl propionate, isopropyl propionate, t-butyl propionate, methyl butyrate, ethyl butyrate, propyl butyrate and t-butyl butyrate, and others; and alcohols such as ethanol, propanol, isopropyl alcohol, n-butanol, t-butyl alcohol, n-hexanol, cyclohexanol, methoxyethanol and t-butoxyethanol, and others.

Pre-heating may be performed prior to the irradiation with ultraviolet light to remove residual solvent and obtain a more densely textured coating film. The need for such pre-heating varies according to the volatility of the solvent, solubility of the substrate and thickness of the coating film. If the base-generating substances is pyrolyzed by this pre-baking, the photo-patternability of the coating will be lost. Accordingly, long-term pre-baking at a temperature near the thermal decomposition temperature of the base-generating substances or at even higher temperatures must be avoided. Considering these points, pre-baking at a temperature of 100° C. or lower is generally appropriate.

After-heating performed following the irradiation with ultraviolet radiation is an important step for accelerating the catalytic reaction chemically amplifying the effect of the radiation. If after-heating is performed at a temperature or for a time greater than that which is necessary, there is a danger that a non-catalytic cross-linking reaction will be promoted in the areas that were not irradiated. Furthermore, a cross-linking reaction may occur in the non-irradiated portions as a result of the generation of a base due to the thermal decomposition of the base-generating substance, or as a result of diffusion of said base-generating substance. Therefore it is desirable to after-heat at a temperature of 200° C. or lower.

In regard to solvents which are appropriate for use as developing agents, the first prerequisite is that the radiation-irradiated portions of the curable composition and the non-irradiated portions of the curable composition show a sufficient difference in solubility in the solvent used. In addition, it is important that the solvent used be a solvent which tends to cause swelling of the radiation-irradiated portions. Examples of solvents which can be used for this purpose include alkaline solvents such as an aqueous solution of tetramethylammonium hydroxide or an aqueous solution of sodium carbonate, as well as those the solvents described above as being useful in the curable composition solution.

The molecular weights, molecular weight distributions and softening points of resins which can be used in the present invention, the types of Si—H functional groups, the types and amounts added of base-generating substances, the ultraviolet irradiation time, the intensity of the ultraviolet radiation, the temperature during irradiation, the humidity during irradiation and the reaction conditions of the cross-linking performed following irradiation (reaction temperature, and time) are interrelated. Accordingly, appropriate conditions cannot be specified as fixed values. However, the pre-heating temperature, the temperature during irradiation with radiation and the temperature during after-heating must be lower than the thermal decomposition temperature of the base-generating substance.

If necessary, sensitizing agents may be added to the composition of the present invention. Examples of sensitizing agents which can be used include N-phenylglycine, N-phenyldiethanolamine, azidoanthraquinone and 3,3'-carbonyl(diethylaminocumarin), and others.

Other components may be added to the curable composition so long as these components do not interfere with the basic constitution of the present invention. In particular, the thermal curing reaction of the remaining negative portions following pattern formation by development can be further promoted by adding a component which acts as a catalyst in the cross-linking reaction of the resin under conditions of high-temperature heating. Examples of such components include radical initiators such as peroxides or azo compounds, and others which promote curing by means of a radical reaction; titanium compounds and tin compounds which promote a condensation reaction involving silanol groups at high temperatures; and transition metal catalysts which show catalytic activity in a hydrosilylation reaction at high temperatures. Other organic or inorganic components which have specified functions or physical properties may also be dissolved or dispersed in the curable composition, forming a cured coating pattern which has desired functions or physical properties.

The present invention, by [1] using a composition consisting of [a] a base-generating substance which is caused to generate a base by the action of ultraviolet light, and [b] a siloxane polymer containing silicon-hydrogen bonds which are capable of reacting with hydroxy groups to form silicon-hydrogen bonds and hydrogen molecules under the effect of the base, and [2] irradiating said composition with ultraviolet light, makes it possible to cure said composition in the irradiated portions of said composition only. By employing this technique, it is possible to form fine mask patterns in the composition of the present invention using ultraviolet light as an image-forming means. By subjecting patterns formed in this way to an after-curing reaction, it is possible to form cure silicon films which are superior in terms of insulating properties, heat resistance and resistance to oxygen plasma.

So that those skilled in the art can understand and appreciate the invention taught herein, the following examples are presented, it being understood that these examples should not be used to limit the scope of this invention found in the claims.

In the example "$^{29}Si\{1H\}$-NMR" refers to the silicon 29 nuclear magnetic resonance spectrum (proton decoupling). $CDCl_3$ indicates heavy chloroform. The information shown in parentheses in the nuclear magnetic resonance (NMR) spectral data indicates the functional groups giving rise to said spectral data. The chemical shifts shown for the silicon 29—NMR spectra are values calculated with the chemical shift of the silicon in the tetramethylsilane ($CDCl_3$ solution) used as an external standard taken as zero.

In the examples and comparative examples, a 200-watt mercury-xenon lamp manufactured by Yamashita Denso K.K. was used as an ultraviolet irradiation source at a distance to 30 cm from the surface being irradiated. At this distance, the intensity of the ultraviolet light was 7.5 milliwatts/cm measured at a wavelength of 254 nm.

Furthermore, a "Toppan Test Chart No. 1-P/N" (pattern line width: 50 microns to 0.877 microns) was used as a photo-mask.

A ULS-500C Lamphouse 500-watt mercury-xenon lamp manufactured by Ushio Denki K.K. was used in order to provide ultraviolet irradiation for the determination of the 50% residual film thickness sensitivity (D50) and gamma contrast (intensity of ultraviolet light: 1 mJ/cm$^2$ to 1 J/cm$^2$, wavelength: 254 nm).

"GPC" refers to gel permeation chromatography.

PREPARATION EXAMPLE 1
Synthesis of Base-Generating Substance 10 ml of toluene, 5.75 g of 2-nitrobenzyl alcohol and 5 g of benzyl isocyanate were heated to reflux for 3 hours in a nitrogen atmosphere. Following cooling of the mixture, 50 ml of toluene was added. This reaction solution was washed several times with water, and was then dehydrated with sodium sulfate. The sodium sulfate was then filtered out, and the solvent was removed from the filtrate by means of a rotary evaporator. The solid obtained was recrystallized from a hexane-toluene mixed solvent, producing 7.3 g of o-nitrobenzyl benzylcarbamate in the form of plate yellow crystals. This compound had a melting point of 110° to 111° C., and the infrared absorption spectrum was 3308 cm$^{-1}$: N—H, 1696 cm$^{-1}$: C=O, 1520 cm$^{-1}$: N—O.

PREPARATION EXAMPLE 2
Synthesis of Base-Generating Substance 12 g of nifedipine was disclosed in 50 ml of tetrahydrofuran in a nitrogen atmosphere. 1.66 g of a sodium hydride/oil dispersion (60% NaH) was added under agitation. Following agitation for some time, 10 ml of methyl iodide was added, and the resulting mixture was agitated for 1 hour at 38° C. 200 ml of ethyl acetate was then added. The resulting organic layer was washed several times with water, and was then dehydrated with sodium sulfate. The sodium sulfate was filtered out, and the solvent was removed. The solid obtained was dissolved in 200 ml of MIBK, and hexane was added producing 8.9 g of N-methylnifedipine in the form of yellow crystals. This compound had a melting point of 184° to 187° C.; an infrared absorption spectrum of 1690 cm$^{-1}$; C=O, 1524 cm$^{-1}$; N—O), and a proton-NMR spectrum (solvent: CDCl$_3$) of 2.5 (6 H, methyl), 3.3 (3H, N-methyl), 3.6 (6H, O-methyl), 5.7 (1H, C—H, 7.2–7.6 (4H, C—H in aromatic nucleus).

PREPARATION EXAMPLE 3
Synthesis of Phenylsilsesquioxane-Hydrodienesilsesquioxane Resin 170 ml of dioxane, 15.4 g of phenyltrichloorsilane and 9.75 g of trichlorosilane were placed in a flask filled with nitrogen. This mixture was cooled in a water bath and a solution prepared by dissolving 8.2 g of water in 60 ml of dioxane was added over a period of 30 minutes. Following agitation for 30 minutes at room temperature, the solvent was removed. The residue was dissolved in 100 ml of toluene, and the resulting organic layer was washed several times with water. After the organic layer was dehydrated with sodium sulfate, the solvent and volatile components were distilled away in vacuo at 60° C., producing a white solid. Molecular weight: 630; infrared absorption spectrum: 2253 cm$^{-1}$ (Si—H), 3358 cm$^{-1}$ (SiOH), 1168 to 1061 cm$^{-1}$ (Si—O—Si).

PREPARATION EXAMPLE 4
Synthesis of Cyclohexylsilsesquioxane-Hydrodienesilsesquioxane Resin 78 g of dioxane, 15.1 g of cyclohexyltrichlorosilane and 6.58 g of trichlorosilane were placed in a flask filled with nitrogen. This mixture was cooled in a water bath and a solution prepared by dissolving 6.23 g of water in 23.7 g of dioxane was added over a period of 30 minutes. Following agitation for 1 hour at room temperature, the solvent was removed. The residue was dissolved in 100 ml of toluene, and the resulting organic layer was washed several times with water. After the organic layer was dehydrated with sodium sulfate, the solvent and volatile components were distilled away in vacuo, producing 14 g of a white solid.

According to the infrared absorption spectrum (2249 cm$^{-1}$ (Si—H), 2924 cm$^{-1}$ (C—H), 2851 cm$^{-1}$ (C—H), 3383 cm$^{-1}$ (SiOH), 1113 to 1067 cm$^{-1}$ (Si—O—Si), and the 1 H, 18 C and silicon 29 NMR spectra, the composition of the resin obtained was $(C_6H_{11}SiO_{3/2})_{0.36}(C_6H_{11}Si(OH)O_{2/2})_{0.55}(C_6H_{11}Si(OH)_2O_{1/2})_{0.08}(HSiO_{3/2})_{0.7}$.

PREPARATION EXAMPLE 5
Polyhydrodienesilsesquioxane

The polyhydrodienesilsesquioxane was obtained from Dow Corning Corporation (Midland, Mich., U.S.A.) and had a molecular weight of 16000; Mw/Mn=approximately 2.5, infrared adsorption spectrum: 2264 cm$^{-1}$ (Si—H); and no adsorption attributable to Si—OH was observed.

PREPARATION EXAMPLE 6
Preparation of Diphenylsiloxane-Methylsilsesquioxane Resin 42.7 g of methyltrichlorosilane was cooled to 0° C. under nitrogen. 46.4 g of diphenylsilanediol dissolved in 37.4 g of pyridine was added to this over a period of 10 minutes under vigorous agitation. The temperature was elevated to room temperature, and agitation was continued for 1 hour. 93 ml of toluene was added to the solution. 200 ml of water was added under vigorous agitation, and agitation was continued for 30 minutes. 200 ml of ether was added to the reaction product, and the organic layer was washed several times with water. Hexane was added and the solution was filtered. The solvent was removed at room temperature, producing 54.7 g of resin. This resin was dissolved in toluene (20% solution), and was heated to reflux for 30 minutes. Infrared absorption spectrum: 3000 to 3600 cm$^{-1}$ (SiOH), 1127 cm$^{-1}$ (Si—Ph), 1030 cm$^{-1}$, 1090 cm$^{-1}$ (Si—O); $^{29}$ Si—NMR (CDCl$_3$): −35 to −47 ppm (Ph$_2$SiO), −50 to −60 ppm (MeSiO(OH)), −6 to −70 ppm (MeSiO$_{3/2}$).

PREPARATION EXAMPLE 7
Preparation of Diphenylsiloxane-Methylhydrodienesiloxane Copolymer 11.8 g of methyldichlorsilane was cooled to 0° C. under nitrogen. 22.1 g of diphenylsilanediol dissolved in 15.9 g of pyridine was added to this over a period of 10 minutes under vigorous agitation. The temperature was elevated to room temperature, and agitation was continued for 1 hour. 150 ml of toluene was added to the solution. 400 ml of water was added under vigorous agitation, and agitation was continued for 30 minutes. The organic layer was separated and was washed several times with water. The organic layer was dehydrated with sodium sulfate and filtered, and the solvent was removed producing 26.9 g of polymer. This polymer was dissolved in 50 ml of toluene and poured into 200 ml of methanol, and the resulting high-molecular-weight polymer was collected as a precipitate. This precipitate was dried in vacuo, producing 15.1 g of polymer. Infrared absorption spectrum: 3071 to 3051 cm$^{-1}$ (C—H), 2164 cm$^{-1}$ (Si—H), 1593 cm$^{-1}$, 1429 cm$^{-1}$, 1260 cm$^{-1}$, 1130 to 1020 cm$^{-1}$ (Si—O); GPC analysis: Mn=5900, Mw=9000.

PREPARATION EXAMPLE 8
Preparation of Phenylsilsesquioxane-Methylhydrodienesiloxane Copolymer 200 ml of ether, 8.0 ml of phenyltrichlorosilane and 5.2 ml of methyldichlorosilane were cooled to 0° C. under nitrogen. 7 g of water dissolved in 15 ml of ether was added to this over a period of 10 minutes under vigorous agitation. The temperature was elevated to room temperature, and agitation was continued for 1 hour. 100 ml of toluene was added, and the resulting solution was washed several times with water. Following dehydration with sodium sulfate and filtration, the solvent was removed producing 8 g of polymer. This polymer was dissolved in 5 ml of toluene and poured into 200 ml of methanol under violent agitation, and the resulting high-molecular-weight polymer was collected by precipitation. This precipitate was dried in vacuo producing 5 g of polymer. GPC molecular weight (calculated as polystyrene): 4300 g/mol; infrared absorption spectrum: 3630, 3420 cm$^{-1}$ (Si—OH), 2230 cm$^{-1}$ (Si—H), 1128 cm$^{-1}$ (Si—Ph), 1092 cm$^{-1}$ (Si—Me).

PREPARATION EXAMPLE 9
Polyphenylsilsesquioxane

The polyphenylsilsesquioxane (GR-950 resin) used was obtained from Showa Denko.

EXAMPLE 1
Photo-Patterning of Phenylsilsesquioxane-Hydrodienesilsesquioxane Resin The base-generating substance synthesized in Preparation Example 2 (N-methylnifedipine) was added to the polyphenylsilsesquioxane-hydrodienesilsesquioxane resin prepared in Preparation Example 3 at the rate of 1 wt % relative to the resin. This mixture was dissolved in toluene to produce a 20 wt % solution. This solution was filtered using a filter with a pore size of 0.45 microns. The solution was applied to a silicon wafer by spin coating (1000 rpm, 5 sec), and was dried at ordinary temperature. Pre-baking was performed for 1 minute at 80° C. The coating film thickness was 1 micron. This wafer was divided into 8 parts, and these parts were subjected to ultraviolet irradiation in amounts ranging from 1 mJ/cm$^2$ to 1 J/cm$^2$ (measured at 254 nm). The exposed samples were post-baked for 1 minute at 100° C., and these post-baked samples were developed for 1 minute with toluene. After the samples were dried, the film thickness was measured at various positions, and a characteristic curve indicating the relationship between amount of exposure and residual film thickness was drawn. The 50% residual film thickness sensitivity (D50) was 4.3 mJ/cm$^2$ and the contrast value gamma was 11.4.
Patterning:

Using the same composition solution, spin-coated wafer samples were prepared under the same conditions as described above. Following pre-baking, photo-masks were superimposed on the samples, and the samples were irradiated with ultraviolet light for 5 seconds. When the silicon wafer samples were washed with toluene and then dried, clear resin patterns corresponding to the negative of the photo-mask were obtained. No remaining resin was seen in the unirradiated portions, indicating that no curing took place in these portions. Observation of the line/space patterns under a microscope showed that a resolving power of 4 microns was obtained. When the silicon wafer samples were further heated for 5 minutes at 150° C., a silanol condensation reaction occurred so that the resin hardened and became toluene-insoluble. The infrared absorption arising from silanol groups (3650 cm$^{-1}$) decreased to approximately ⅕ the original value. No change was seen in the resin patterns.

EXAMPLE 2
Photo-Patterning of Cyclohexylsilsesquioxane-Hydrodienesilsesquioxane Resin The base-generating substance prepared in Preparation Example 2 (N-methylnifedipine) was added to the cyclohexylsilsesquioxane-hydrodienesilsesquioxane resin prepared in Preparation Example 4 at the rate of 2 wt % relative to the resin. This mixture was dissolved in toluene to produce a 20 wt % solution. This solution was filtered using a filter with a pore size of 0.45 microns. The solution was applied to a silicon wafer by spin coating (500 rpm, 5 sec, 1500 rpm, 15 sec), and was pre-baked for 1 minute at 80° C. The coating film thickness was 1.3 microns. Values of D50=4 mJ/cm$^2$ and gamma=1.8 were obtained by the same procedure as in Example 1.

Using the same composition solution, spin-coated wafer samples were prepared under the same conditions as described above. Following prescribed pre-baking, photo-masks were superimposed on the samples, and the samples were irradiated with ultraviolet light for 5 seconds. When these silicon wafer samples were washed with toluene and dried, clear resin patterns corresponding to the negative of the photo-mask were obtained. No remaining resin was seen in the unirradiated portions, indicating that no curing took place in these portions. Observation of the line/space patterns under a microscope showed that a resolving power of 4 microns was obtained.

EXAMPLE 3
Photo-Pattering of Polyhydrodienesilsesquioxane

The base-generating substance prepared in Preparation Example 2 (N-methylnifedipine) was added to the polyhydrodienesilsesquioxane resin prepared in Preparation Example 5 at the rate of 0.5 wt % relative to the resin. This mixture was dissolved in methyl isobutyl ketone to produce a 20 wt % solution. This solution was filtered using a filter with a pore size of 0.45 microns. The solution was applied to a silicon wafer by spin coating (500 rpm, 5 sec), and was dried at ordinary temperature. Pre-baking was then performed for 1 minute at 80° C. The coating film thickness was 1.0 microns. Values of D50=18 mJ/cm$^2$ and gamma=7.1 was obtained by the same procedure as in Example 1.

Using the same composition solution, spin-coated wafer samples were prepared under the same conditions as described above. Following prescribed pre-baking, photo-masks were superimposed on the samples, and the samples were irradiated with ultraviolet light for 5 seconds. When these silicon wafer samples were washed with toluene and then dried, clear resin patterns corresponding to the negative of the photo-mask were obtained. No remaining resin was seen in the unirradiated portions, indicating that no curing took place in these portions. Observation of the line/space patterns under a microscope showed that a resolving power of 4 microns was obtained.

When these patterns were heated for 1 hour at 400° C. in air, the resin samples were vitrified with the patterns maintained.

EXAMPLE 4
Photo-Patterning of Diphenylsiloxane-Methylhydrodienesiloxane Copolymer The base-generating substance prepared in Preparation Example 2 (N-methylnifedipine) was added to the diphenylsiloxane-methylhydrodienesiloxane copolymer prepared in Preparation Example 7 at the rate of 2 wt % relative to the copolymer resin. This mixture was dissolved in methyl isobutyl ketone to produce a 20 wt % solution. This solution was filtered using a filter with a pore size of 0.45 microns. The solution was applied to a silicon wafer by spin coating (1000 rpm, 5 sec), and was dried at ordinary temperature. Pre-baking was performed for 1 minute at 80° C. The coating film thickness was 1 micron. A photo-mask was superimposed, and the sample was irradiated with ultraviolet light for 10 seconds. When this silicon wafer sample was washed with toluene and then dried, a clear resin pattern corresponding to the negative of the photo-mask was obtained. No remaining resin was seen in the unirradiated portions, indicating that no curing took place in these portions. Observation of the line/space pattern under a microscope showed that a resolving power of 50 microns was obtained.

EXAMPLE 5
Photo-Patterning of Phenylsilsesquioxane-Methylhydrodienesiloxane Copolymer The base-generating substance prepared in Preparation Example 2 (N-methylnifedipine) was added to the phenylsilsesquioxane-methylhydrodienesiloxane copolymer described in Preparation Example 8 at the rate of 2 wt % relative to the copolymer resin. This mixture was dissolved in methyl isobutyl ketone to produce a 20 wt % solution. This solution was filtered using a filter with a pore size of 0.45 microns. The solution was applied to a silicon wafer by spin coating (1000 rpm, 5 sec), and was dried at ordinary temperature. Pre-baking was then performed for 1 minute at 80° C., The coating film thickness was 1 micron. A photo-mask was superimposed, and the sample was irradiated with ultraviolet light for 1 second. When this silicon wafer sample was washed with toluene and dried after being post-baked for 1 minute at 80° C., a clear resin pattern corresponding to the negative of the photo-mask was obtained. No remaining resin was seen in the unirradiated portions indicating that no curing took place in these portions. Observation of the line/space pattern under a microscope showed that a resolving power of 20 microns was obtained.

COMPARATIVE EXAMPLE 1
Photo-Curing of Polyhydrodienesilsesquioxane

The photo-base prepared in Preparation Example 1 (o-nitrobenzyl benzylcarbamate) was added to the polyhydrodienesilsesquioxane prepared in Preparation Example 5 at the rate of 5 wt % relative to the resin. This mixture was dissolved in toluene to produce a 20 wt % solution. This solution was filtered using a filter with a pore size of 0.45 microns. The solution was applied to a silicon wafer by spin coating (1000 rpm, 5 sec), and was dried at ordinary temperature. Pre-baking was performed for 1 minute at 80° C. The coating film thickness was 1 micron. Values of D50=35 mJ/cm$^2$ and gamma=1.7 were obtained by the same procedure as in Example 1.

Using the composition solution, spin-coated wafer samples were prepared under the same conditions as described above. Following prescribed pre-baking, photo-masks were superimposed on the samples, and the samples were irradiated with ultraviolet light for 5 seconds. The samples were then post-baked for 40 seconds at 80° C. When these silicon wafer samples were washed with toluene and then dried, clear resin patterns corresponding to the negative of the photo-mask were obtained. No remaining resin was seen in the unirradiated portions indicating that no curing took place in these portions. Observation of the line/space patterns under a microscope showed that a resolving power of 4 microns was obtained.

These silicon wafer samples were additionally heated for 30 minutes at 150° C. However, almost no decrease in the ultraviolet absorption arising from Si—H (2200 cm$^{-1}$) was seen. There was no change in the resin patterns.

COMPARATIVE EXAMPLE 2
Photo-Curing of Diphenylsiloxane-Methylsilsesquioxane Resin The photo-base substance synthesized in Preparation Example 2 (N-methylnifedipine) was dissolved in a 20% toluene solution of the diphenylsiloxane-methylsilsesquioxane resin prepared in Preparation Example 6 at the rate of 2 wt % relative to the resin. This solution was applied to a silicon wafer by spin coating, and was dried at ordinary temperature. A photo-mask was superimposed on the resin-coated surface of the silicon wafer, and the coated wafer was irradiated with ultraviolet light for 1 minute. When this silicon wafer was washed with toluene after being heated for 1 hour at 100° C. and then cooled, the resin was completely dissolved and removed, indicating that no curing took place.

COMPARATIVE EXAMPLE 3
Photo-Curing of Phenylsilsesquioxane Resin

The photo-base substance synthesized in Preparation Example 2 (N-methylnifedipine) was dissolved in a 20% toluene solution of the phenylsilsesquioxane resin prepared in Preparation Example 9 at the rate of 2 wt % relative to the resin. This solution was applied to a silicon wafer by spin coating, and was dried at ordinary temperature. A photo-mask was superimposed on the resin-coated surface of the silicon wafer, and the coated wafer was irradiated with ultraviolet light for 1 minute. When this silicon wafer was washed with toluene after being heated for 1 hour at 100° C. and then cooled, the resin was completely dissolved and removed indicating that no curing took place.

What is claimed is:

1. A curable composition comprising:
   (a) 0.01 to 20 wt % based on the total weight of the composition of a N-substituted 4-(o-nitrophenyl) dihydropyridines; and
   (b) a siloxane polymer having the general formula

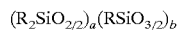

$$(R_2SiO_{2/2})_a(RSiO_{3/2})_b$$

wherein each R is independently selected from the group consisting essentially of hydrogen atoms and hydrocarbon group with 1 to 8 carbon atoms with the provision that the sum of the moieties in which the R in $RSiO_{3/2}$ is a hydrogen atom and the moieties in which one or both of the R's in $R_2SiO_{2/2}$ is a hydrogen atom is at least 5% of amount of $RSiO_{3/2}$ unit and $R_2SiO_{2/2}$ unit; and $0 \leq a \leq 1$, $0 \leq b \leq 1$ and a+b=1.

2. The curable composition as claimed in claim 1 which further contains (c) a cross-linking agent selected from the group consisting of silanes which have an average of at least two silanol groups per molecule, silicone polymers which have an average of at least two silanol groups per polymer molecule and water.

3. The curable coating composition as claimed in claim 1 wherein the N-substituted 4-(o-nitrophenyl)dihydropyridine is present in the curable composition in an amount of 0.05 to 10 wt %.

4. The curable coating composition as claimed in claim 1 wherein the N-substituted 4-(o-nitrophenyl)dihydropyridine is a compound wherein a substituent group bonded to the dihydropyridine in position 1 is selected from the group consisting essentially of alkyl groups, alkenyl groups, aryl groups and aralkyl groups; in which a substituent group bonded to the dihydropyridine in positions 2 and 6 are hydrocarbon groups with 1 to 3 carbon atoms; and in which a substituent group bonded to the dihydropyridine in position 3 and 5 are alkoxycarbonyl groups selected from a set consisting of alkoxy groups with 1 to 4 carbon atoms.

5. The curable composition as claimed in claim 1 wherein the siloxane polymer is of the general formula $(HRSiO_{2/2})_a(RSiO_{3/2})_b$.

6. The curable composition as claimed in claim 1 wherein the siloxane polymer is of the general formula $(R_2SiO_{2/2})_a(HSiO_{3/2})_b$.

7. The curable composition as claimed in claim 1 wherein the siloxane polymer is of the general formula $(HSiO_{3/2})_b$.

8. The curable composition as claimed in claim 1 wherein the siloxane polymer contains at least two silanol groups per molecule.

9. The curable composition as claimed in claim 1 wherein there is additionally present a solvent.

10. A method for forming a cured-product pattern corresponding to the negative of a photo-mask, wherein said method comprises:
    (A) applying the curable composition as claimed in claim 1 to a substrate
    (B) placing a photomask which partially blocks the ultraviolet radiation between the coating and an ultraviolet radiation source,
    (C) irradiating the coating composition with ultraviolet light,
    (D) heating the irradiated coating at a temperature of 0° to 200° C.,
    (E) dissolving and removing any uncured composition by contacting the coating with a solvent.

11. The method as claimed in claim 10 wherein the coating is applied by spin coating.

12. The method as claimed in claim 10 wherein the coating is irradiated at a temperature of 0° C. to 100° C. in an atmosphere with a relative humidity of 10% or greater.

13. The method as claimed in claim 10 wherein the coating is irradiated for a time sufficient until at least 10% of the N-substituted 4-(o-nitrophenyl)dihydropyridine present in the curable composition has been converted to a base.

14. The method as claimed in claim 10 wherein the coating is heated to a temperature of 100° C. or lower prior to irradiating the coating with ultraviolet light.

15. A method for forming a cured-product pattern corresponding to the negative of a photo-mask, wherein said method comprises
    (A) applying the composition as claimed in claim 2 to a substrate
    (B) placing a photomask which partially blocks the ultraviolet radiation between the coating and an ultraviolet radiation source,
    (C) irradiating the coating composition with ultraviolet light,
    (D) heating the irradiated coating at a temperature of 0° C. to 200° C.,
    (E) dissolving and removing any uncured composition by contacting the coating with a solvent.

16. The method as claimed in claim 15 wherein the coating is applied by spin coating.

17. The method as claimed in claim 15 wherein the coating is irradiated for a time sufficient until at least 10% of the N-substituted 4-(o-nitrophenyl)dihydropyridine present in the curable composition has been converted to a base.

18. The method as claimed in claim 15 wherein the coating is heated to a temperature of 100° C. or lower prior to irradiating the coating with ultraviolet light.

19. The curable composition as claimed in claim 1 wherein the siloxane polymer is of the general formula $(HSiO_{3/2})_{b'}(RSiO_{3/2})_{b''}$ (wherein b'+b"=b).

* * * * *